(12) United States Patent
Kubota

(10) Patent No.: US 11,565,638 B2
(45) Date of Patent: Jan. 31, 2023

(54) ELECTRIC CONNECTION BOX

(71) Applicant: Yazaki Corporation, Tokyo (JP)

(72) Inventor: Minoru Kubota, Makinohara (JP)

(73) Assignee: Yazaki Corporation, Tokyo (JP)

( * ) Notice: Subject to any disclaimer, the term of this patent is extended or adjusted under 35 U.S.C. 154(b) by 372 days.

(21) Appl. No.: 16/935,579

(22) Filed: Jul. 22, 2020

(65) Prior Publication Data

US 2021/0024021 A1    Jan. 28, 2021

(30) Foreign Application Priority Data

Jul. 23, 2019   (JP) .............................. JP2019-135492

(51) Int. Cl.
| | | |
|---|---|---|
| *B60R 16/023* | (2006.01) | |
| *H02G 3/08* | (2006.01) | |
| *H02G 3/16* | (2006.01) | |
| *H05K 5/00* | (2006.01) | |
| *H05K 7/20* | (2006.01) | |

(52) U.S. Cl.
CPC ......... *B60R 16/0238* (2013.01); *H02G 3/081* (2013.01); *H02G 3/16* (2013.01); *H05K 5/0073* (2013.01); *H05K 7/20145* (2013.01)

(58) Field of Classification Search
CPC .. B60L 1/00; B60L 2240/525; B60R 16/0238; B60R 16/03; H02G 3/081; H02G 3/16; H02G 3/03; H02M 3/003; H02M 1/327; H05K 5/0073; H05K 7/20145
See application file for complete search history.

(56) References Cited

U.S. PATENT DOCUMENTS

| | | |
|---|---|---|
| 5,424,915 A | 6/1995 | Katooka et al. |
| 2007/0000231 A1 | 1/2007 | Otsuka et al. |
| 2014/0347831 A1* | 11/2014 | Snider .................... G04G 5/002 361/752 |
| 2016/0332524 A1* | 11/2016 | Yoon ..................... H02M 7/003 |
| 2018/0072135 A1 | 3/2018 | Masuda et al. |
| 2018/0215284 A1 | 8/2018 | Otani et al. |
| 2020/0016775 A1 | 1/2020 | Tagashira |

FOREIGN PATENT DOCUMENTS

| | | |
|---|---|---|
| EP | 2316684 A1 | 5/2011 |
| JP | H07-095771 A | 4/1995 |
| JP | 2002-369550 A | 12/2002 |
| JP | 2012-119587 A | 6/2012 |
| JP | 2019-021731 A | 2/2019 |
| WO | 2018-155693 A1 | 8/2018 |

* cited by examiner

*Primary Examiner* — Jean F Duverne
(74) *Attorney, Agent, or Firm* — Banner & Witcoff, Ltd.

(57) ABSTRACT

An electric connection box that has a function of relaying power of power supply supplied from an input-side power supply line and supplying the relayed power of power supply to an output-side load on a vehicle, that includes a first circuit unit, a second circuit unit, and an air blower configured to blow air to the first circuit unit, and in which the first circuit unit and the second circuit unit are arranged in a state of being close to each other, the electric connection box includes: a gap portion that is a space formed on a boundary between the first circuit unit and the second circuit unit; and an airflow guide portion configured to guide an airflow blown by the air blower to both the first circuit unit and the gap portion.

5 Claims, 10 Drawing Sheets

ELECTRIC CONNECTION BOX

CROSS REFERENCE TO RELATED APPLICATIONS

This application is based on and claims priority from Japanese patent application No. 2019-135492 filed on Jul. 23, 2019, the entire contents of which are incorporated herein by reference.

BACKGROUND OF THE INVENTION

1. Technical Field

The present invention relates to an electric connection box that can be used to supply power to various electrical components on a vehicle.

2. Background Art

A vehicle such as an automobile generally includes an in-vehicle battery as a main power supply. Further, the vehicle includes an alternator (generator) to charge the in-vehicle battery. Then, DC power of power supply is supplied from the main power supply to a large number of various electrical components, that is, loads mounted on various parts of the vehicle. The loads of the vehicle are respectively used to implement various functions such as running, steering, stopping, opening and closing of a door, lighting, and communication of the vehicle constantly or as necessary, and require a supply of the power of power supply.

On the vehicle, the main power supply and the electrical components are electrically connected to each other via a wire harness in order to mainly enable a supply of the power of power supply from the main power supply to the electrical components. The wire harness is basically an assembly of a large number of electric wires and generally has a complicated shape and structure.

In order to distribute the power of power supply from the main power supply to a plurality of output-side paths, or to control on and off of the power supply to the loads, or to enable protection of the power supply, the loads, and the like, an electric connection box is generally connected to an intermediate portion of the wire harness. As a typical electric connection box, a junction block (J/B), a relay box (R/B), and the like are known.

In recent years, in a power supply on a vehicle, a DC/DC converter may be used to appropriately use a plurality of power supply systems having different voltages, or an inverter may be used to drive a load such as an electric motor so as to generate AC power, or the AC power may be converted into DC power. Further, since a power supply used for such an application, that is, a power conversion apparatus periodically repeats switching of relatively large power, a power loss consumed inside the power supply tends to increase, and a heat generation amount also tends to increase in proportion to the power loss.

Therefore, it is necessary to cool the power conversion apparatus in order to avoid an excessive temperature rise. For example, a power conversion apparatus of Patent Literature 1 discloses a technology for improving cooling performance so as to miniaturize a power supply.

Specifically, it is disclosed that out of two types of electronic components mounted on a control board disposed in an inverter case, an electronic component having a small heat generation amount, and an electronic component that has a large heat generation amount and is in a physically non-contact state with the control board or a radiator provided at the electronic component that has the large heat generation amount are embedded in a resin having heat conductivity, and heat generated from the electronic component, which has the large heat generation amount and transfers heat to the resin, is transferred to the inverter case.

CITATION LIST

Patent Literature

[Patent Document 1] JP-A-2002-369550

SUMMARY

An electric connection box used on a vehicle may require various control functions in addition to that of the power conversion apparatus. For example, a control function is required which appropriately distributes power of power supply of one system on an input side to a plurality of output systems in accordance with a situation. Further, a control function is also required which prevents an excessively large current from flowing to a load or detects generation of an abnormality so as to cut off energization. Further, a control function is also required which switches a path for supplying power of power supply to a load, or switches a path for charging and discharging to a sub-battery or the like, or supplies backup power from the sub-battery to the load when a failure is generated.

Further, it is desirable that an electronic control unit (ECU) that performs control related to a power supply as described above is disposed so as to be integrated with a power conversion apparatus. That is, a wire harness that performs connection between the electronic control unit and the power conversion apparatus can be reduced because of the integration of the electronic control unit and the power conversion apparatus, and a space necessary for arranging the electronic control unit and the power conversion apparatus can also be reduced.

However, in an electric connection box in which the power conversion apparatus and the electronic control unit are integrated, there is a concern that an ambient temperature of the electronic control unit may exceed an allowable range due to an influence of heat generation of the power conversion apparatus. Since a microcomputer or the like configured by integrating a huge number of semiconductor elements is generally mounted on the electronic control unit, it is difficult to increase resistance to a temperature rise, and increasing the resistance to the temperature rise causes an increase in cost.

Therefore, when a load that consumes a large current is mounted on a vehicle, it is an object to sufficiently cool the power conversion apparatus in order to avoid generation of heat damage or to prevent a temperature rise of the electronic control unit due to heat transfer from the power conversion apparatus. However, for example, when a radiator (heat sink) to be mounted on the power conversion apparatus is enlarged, the entire electric connection box is enlarged, and a weight thereof is also increased. Further, the same applies to a case where a large-sized air blower is mounted. Further, a special cooling apparatus such as a water-cooling apparatus has a complicated structure, and there is a concern of a cost increase.

The present invention has been made in view of the above-described circumstances, and an object thereof is to provide an electric connection box that is easy to prevent generation of heat damage even when a large current is supplied to a load while avoiding enlarging the entire apparatus.

In order to achieve the above object, the electric connection box according to the present invention is characterized by the following items (1) to (5).

(1) An electric connection box that has a function of relaying power of power supply supplied from an input-side power supply line and supplying the relayed power of power supply to an output-side load on a vehicle, that includes a first circuit unit having a relatively large heat generation characteristic, a second circuit unit that has a heat generation amount smaller than that of the first circuit unit and tends to be influenced by a temperature rise, and an air blower configured to blow air to the first circuit unit, and in which the first circuit unit and the second circuit unit are arranged in a state of being close to each other, the electric connection box comprising:

a gap portion that is a space formed on a boundary between the first circuit unit and the second circuit unit, and is configured to allow air to flow through the space; and an airflow guide portion configured to guide an airflow blown by the air blower to both the first circuit unit and the gap portion.

(2) The electric connection box according to above (1), wherein the first circuit unit includes a radiator disposed on a side separated from the gap portion, the radiator is configured with a plurality of heat radiation fins arranged in parallel to one another, and at least one of the air blower and the airflow guide portion blows air along an extending direction of the heat radiation fins.

(3) The electric connection box according to above (1), further comprising:

a first housing in which the first circuit unit is housed and a second housing in which the second circuit unit is housed, wherein the gap portion is formed by a member configured to hold an interval between the first housing and the second housing constant.

(4) The electric connection box according to above (1), wherein the first circuit unit includes a power converter including a semiconductor switching element, and the second circuit unit includes a controller including a semiconductor integrated circuit.

(5) The electric connection box according to above (4), wherein the second circuit unit includes a temperature detection unit configured to detect a temperature of an ambient environment, and a temperature information transmission unit configured to transmit information of a temperature detected by the temperature detection unit to outside.

According to the electric connection box having the above configuration (1), the airflow guide portion can guide the airflow blown by the air blower to both the first circuit unit and the gap portion. Therefore, the heat insulation layer is formed by the airflow that constantly flows through the gap portion. That is, heat generated by heat generation of the first circuit unit is cut off by the heat insulation layer and is not transferred to the second circuit unit, and a temperature rise of the second circuit unit is prevented. Further, since the heat insulation layer is formed by the airflow that constantly flows, as compared with a case where there is no airflow, it is not necessary to largely increase a distance between the first circuit unit and the second circuit unit, and enlargement of the apparatus can be avoided. Further, since the formation of the heat insulation layer and the cooling of the first circuit unit are performed at the same time using the common air blower, it is not necessary to increase the number of components, and complication of the configuration of the apparatus can also be avoided.

According to the electric connection box having the above configuration (2), since the radiator provided in the first circuit unit is disposed on the side separated from the gap portion, air is blown toward the radiator so as to effectively cool the first circuit unit. Particularly, since air is blown along a direction of an uneven shape of the radiator, turbulence does not tend to be generated in the flow of the airflow, and it becomes easy to secure a sufficient flow velocity in the vicinity of the radiator and to efficiently performs cooling.

According to the electric connection box having the above configuration (3), the gap portion is formed by the first housing and the second housing arranged in a state of facing each other. Therefore, a spatial shape of the gap portion is made uniform, and airflow that passes through the space can pass therethrough in a stable state. Therefore, a sufficient flow velocity can be secured in the gap portion, and a high heat insulation effect can be obtained.

According to the electric connection box having the above configuration (4), the power converter provided in the first circuit unit is used, so that a power supply voltage to be supplied to a load can be changed, or a type of power of power supply required by the load can be generated. Further, since the semiconductor integrated circuit is mounted on the second circuit unit, various control functions can be implemented. Further, since the semiconductor integrated circuit does not tend to be influenced by heat generation of the first circuit unit, malfunction due to heat damage can be prevented.

According to the electric connection box having the above configuration (5), since a temperature of the second circuit unit can be detected, the air blower can be controlled in accordance with the temperature of the second circuit unit.

According to the electric connection box of the present invention, it is easy to prevent the generation of the heat damage even when the large current is supplied to the load while avoiding enlarging the entire apparatus.

The present invention has been briefly described above. Further, details of the present invention are further clarified by reading a mode for carrying out the invention (hereinafter, referred to as "embodiment") described below with reference to the attached drawings.

DETAILED DESCRIPTION OF EMBODIMENTS

A specific embodiment of the present invention will be described below with reference to the drawings.

<Configuration Example of Electric Connection Box>

Figure 1:
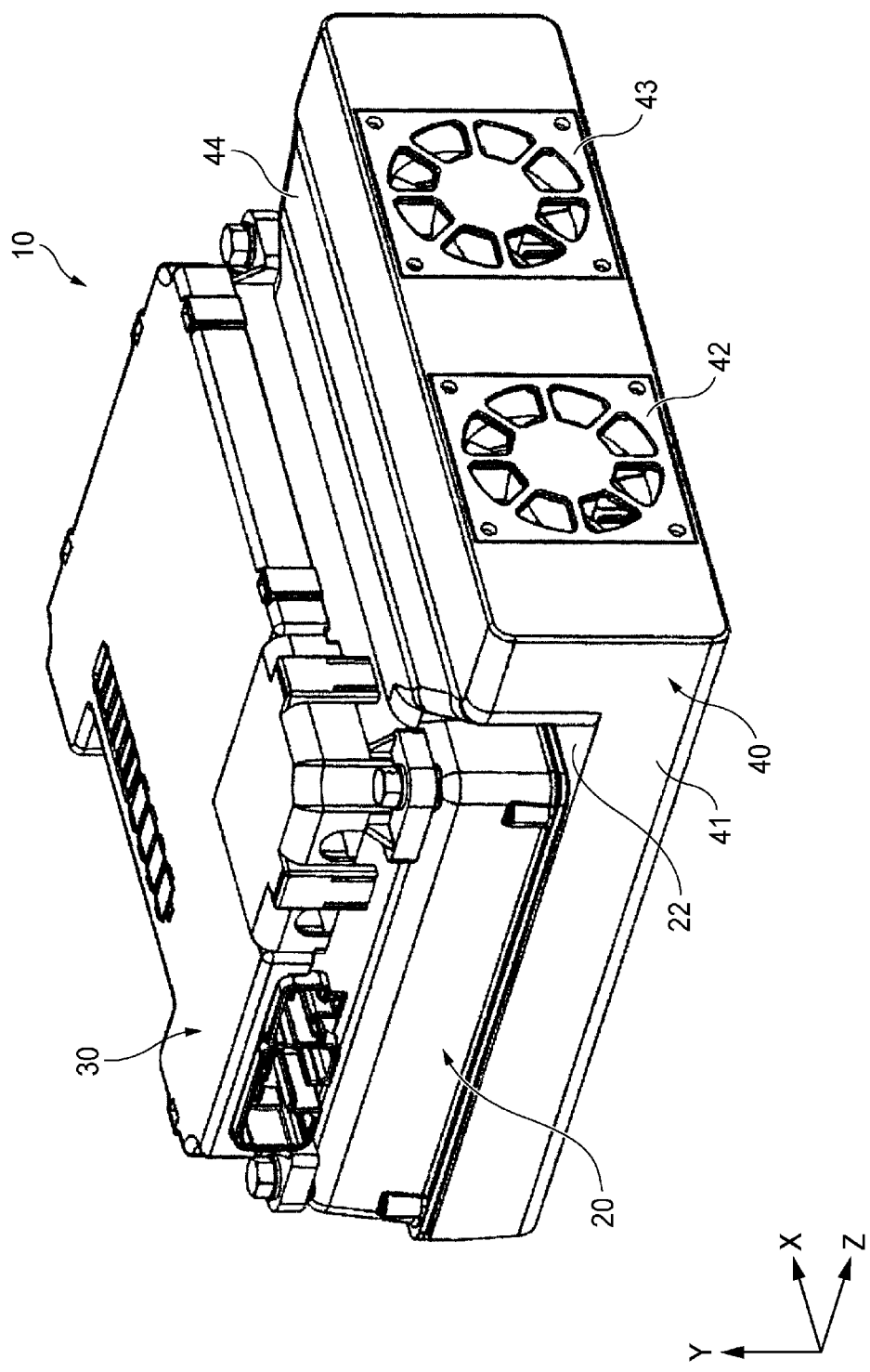
FIG. 1 is a perspective view showing an external appearance of an entire electric connection box according to an embodiment of the present invention.
Figure 2:
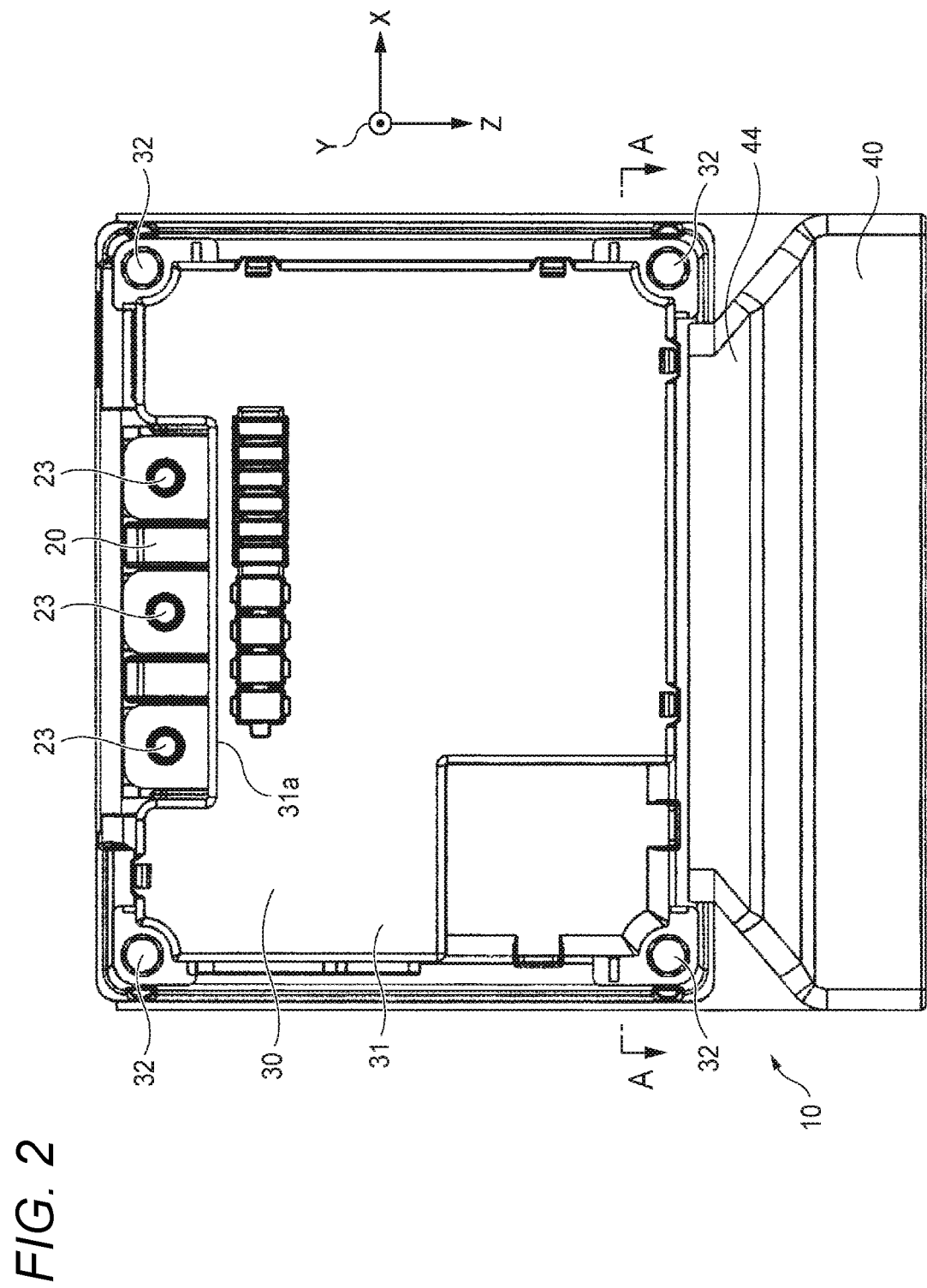
FIG. 2 is a plan view showing the same electric connection box as that in FIG. 1.
Figure 3:
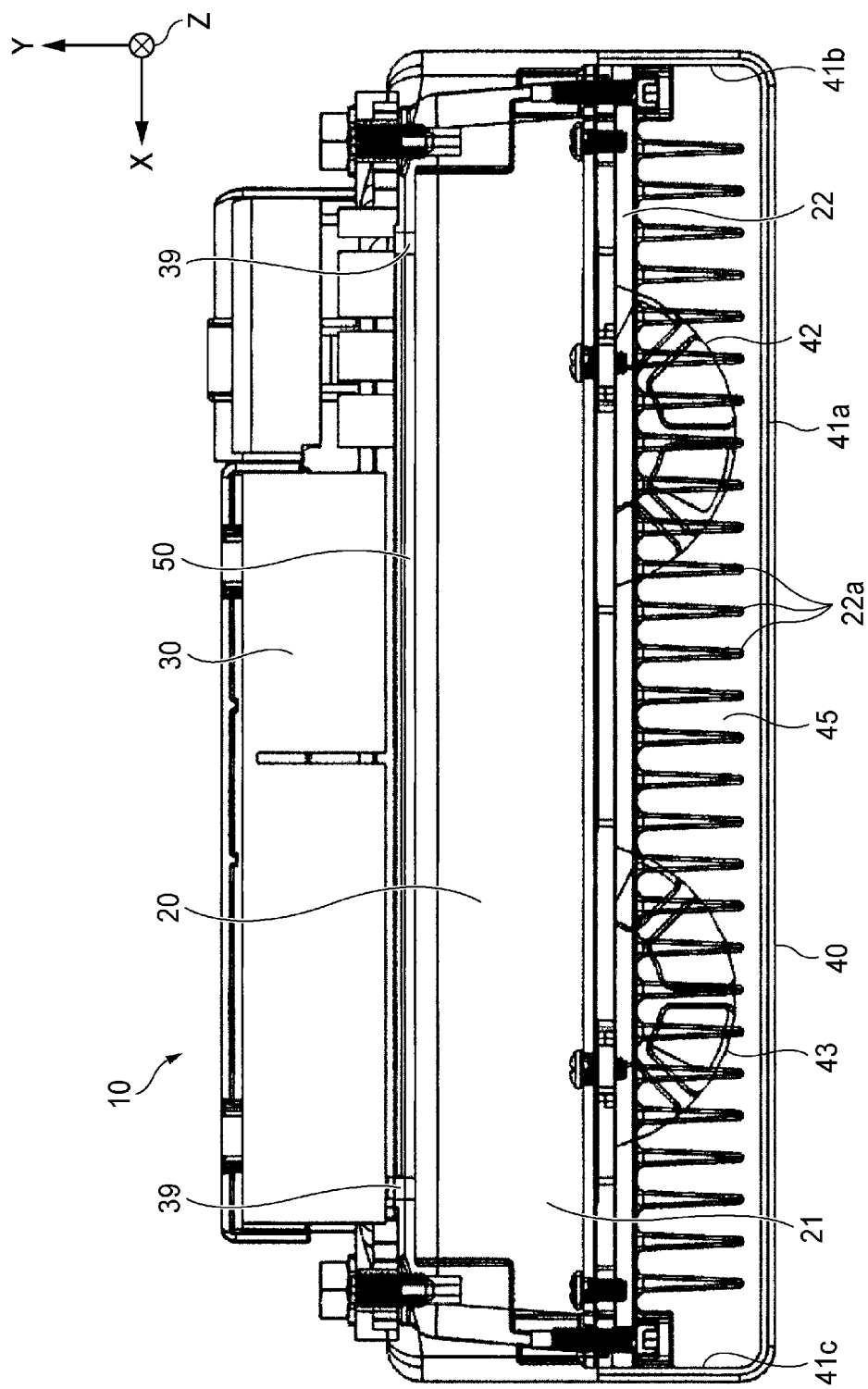
FIG. 3 is a vertical cross-sectional view taken along a line A-A in FIG. 2.
Figure 4:
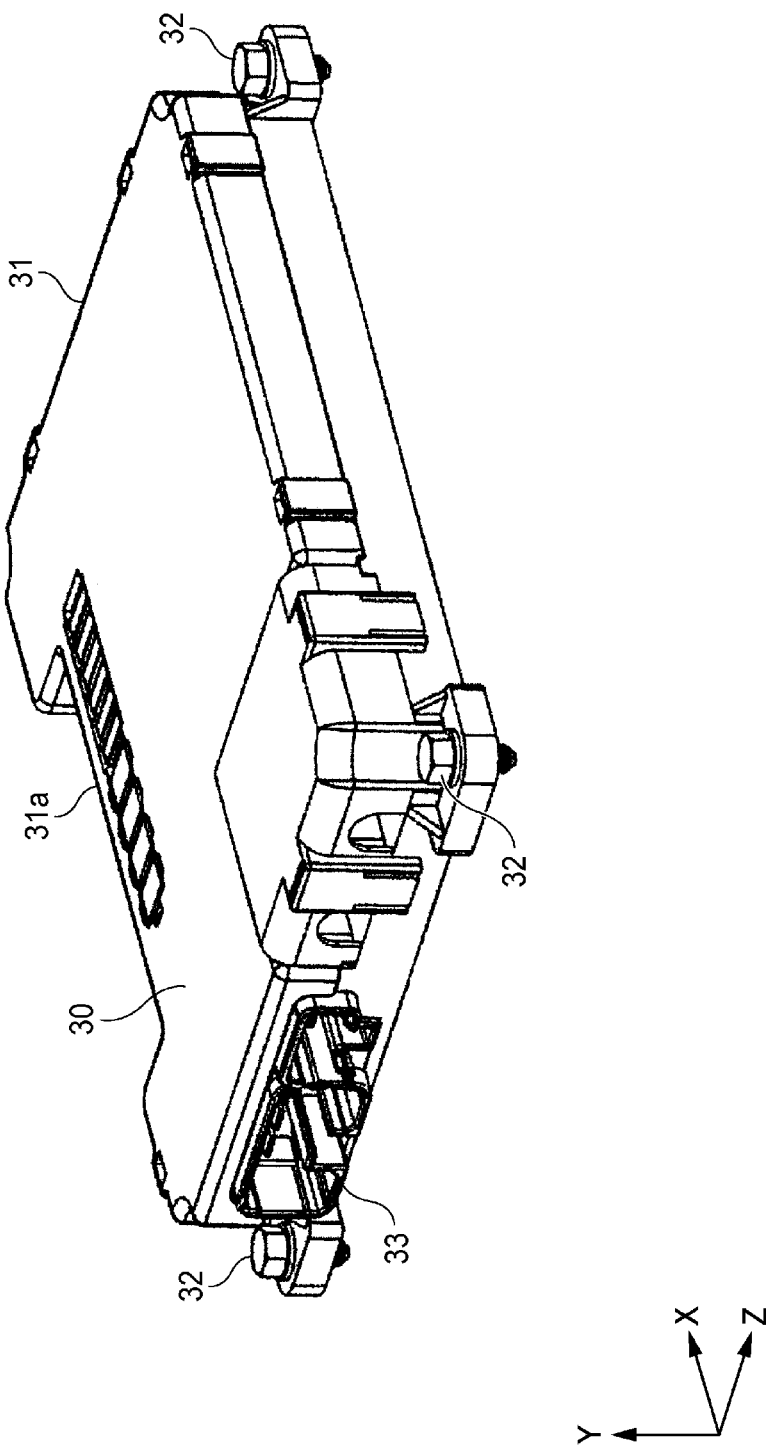
FIG. 4 is a perspective view showing an external appearance of a power supply control unit that constitutes the electric connection box of FIG. 1.
Figure 5:
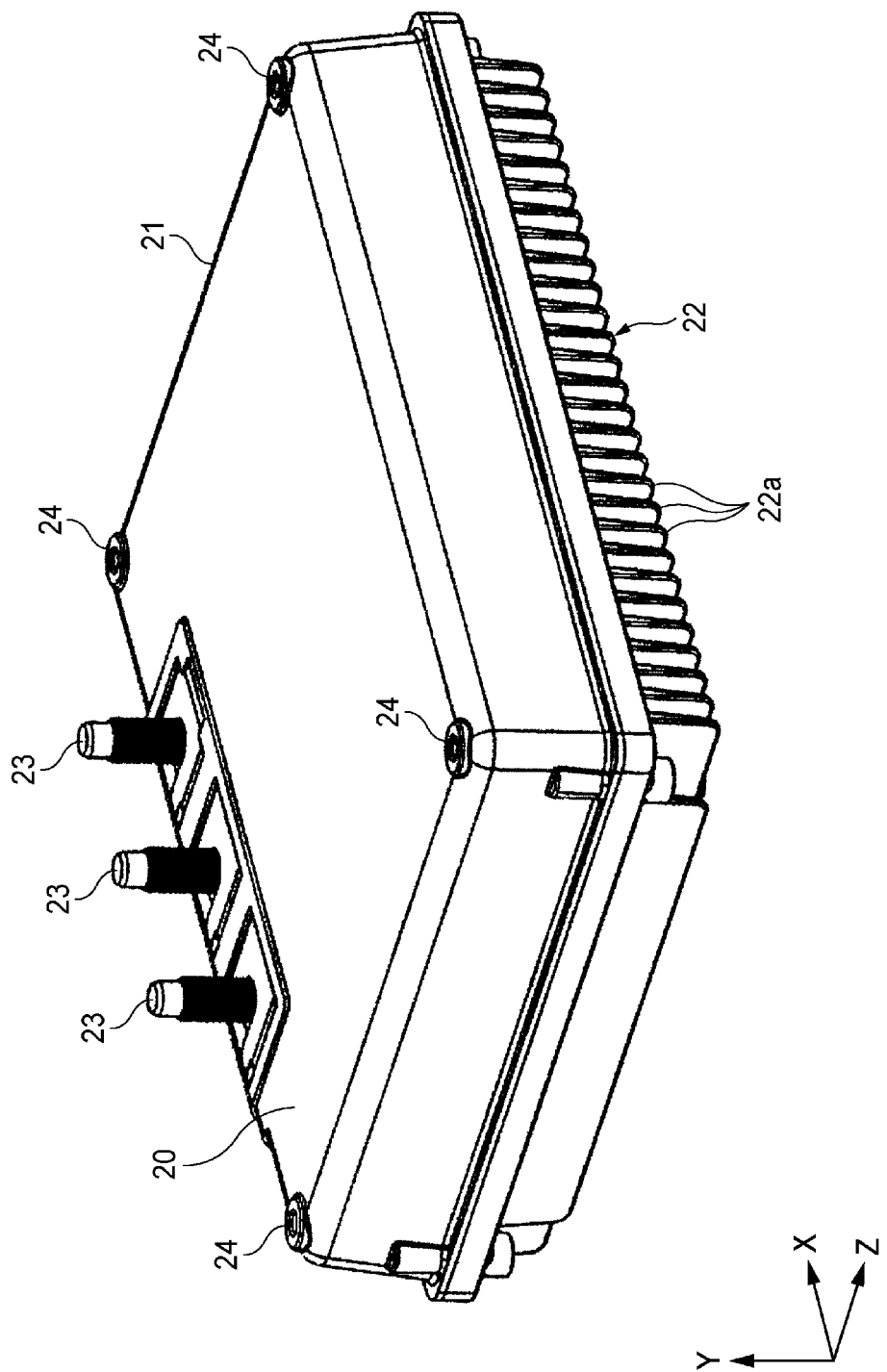
FIG. 5 is a perspective view showing an external appearance of a power conversion unit that constitutes the electric connection box of FIG. 1.
Figure 6:
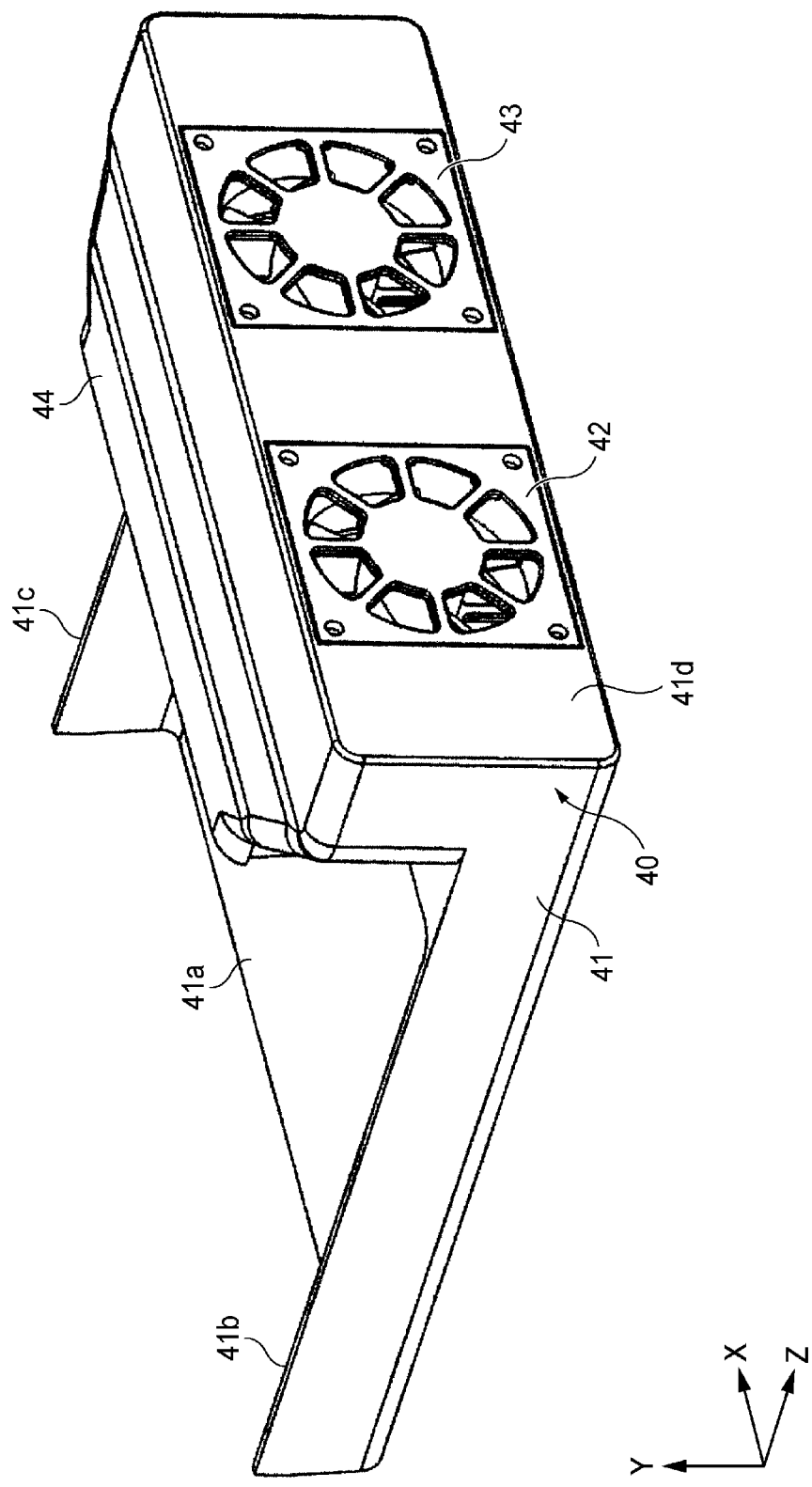
FIG. 6 is a perspective view showing an external appearance of a cooling unit that constitutes the electric connection box of FIG. 1.
Figure 7:
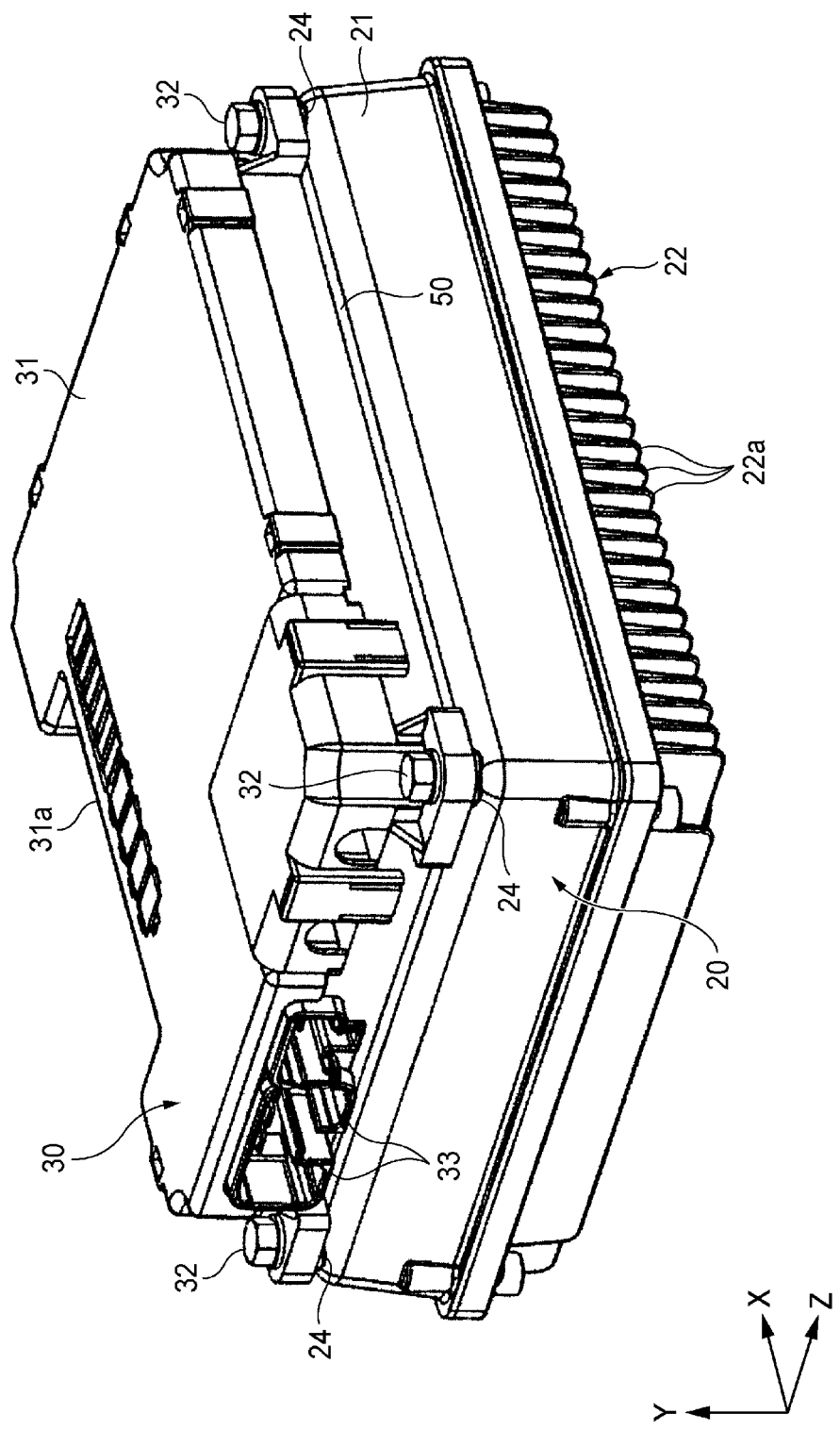
FIG. 7 is a perspective view showing a state where the power conversion unit and the power supply control unit are combined.
Figure 8:
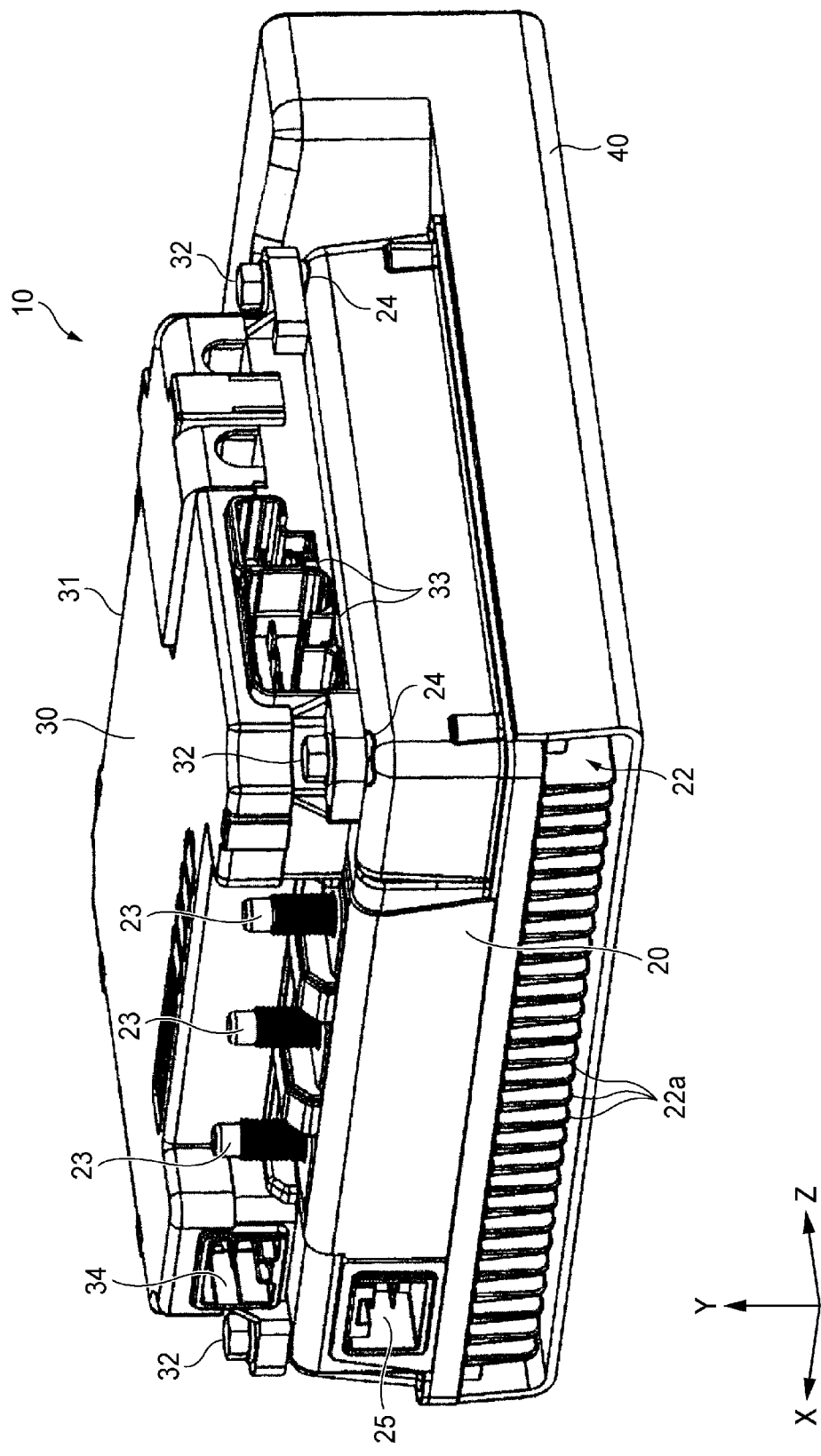
FIG. 8 is a perspective view showing the external appearance of the entire electric connection box when viewed from a direction different from that of FIG. 1.

FIG. 1 is a perspective view showing an external appearance of an entire electric connection box 10 according to an embodiment of the present invention. FIG. 2 is a plan view showing the same electric connection box 10 as that in FIG. 1. FIG. 3 is a vertical cross-sectional view taken along a line A-A in FIG. 2. FIG. 4 is a perspective view showing an external appearance of a power supply control unit 30 that constitutes the electric connection box 10 of FIG. 1. FIG. 5 is a perspective view showing an external appearance of a power conversion unit 20 that constitutes the electric connection box 10 of FIG. 1. FIG. 6 is a perspective view showing an external appearance of a cooling unit 40 that constitutes the electric connection box 10 of FIG. 1. FIG. 7 is a perspective view showing a state where the power conversion unit 20 and the power supply control unit 30 are combined. FIG. 8 is a perspective view showing the external appearance of the entire electric connection box 10 when viewed from a direction different from that of FIG. 1.

<Basic Functions of Electric Connection Box>

The electric connection box 10 shown in FIGS. 1 to 8 is installed in a vehicle cabin or a luggage room of a vehicle and is used to supply power of power supply to various loads on the vehicle, that is, electrical components in appropriate states.

For example, when power that can be supplied from a main power supply such as an in-vehicle battery is not sufficient, in such a situation at that time, it is desirable to preferentially supply power of power supply only to a load having a high degree of importance and to limit a supply of power of power supply to a load having a low priority. The electric connection box 10 includes an electronic control unit that implements such a function.

When a main power supply upstream of the electric connection box 10 includes a plurality of power supplies of systems having different voltages, or when the power of power supply is supplied to a plurality of types of loads that require different power supply voltages, a power conversion unit such as a DC/DC converter is required to deal with switching of the power supply voltage. For example, when an electric motor is driven, a power conversion unit such as an inverter is required to generate predetermined AC power required by the electric motor. The electric connection box 10 also includes such a power conversion unit.

In the power conversion unit as described above, since switching of large power is repeated periodically in the power conversion unit, heat is generated due to an internal loss in the power conversion unit and a temperature rises. Particularly, when a large current flows to a load, a heat generation amount of the power conversion unit may increase to generate a high temperature. Therefore, although a radiator is mounted or a forced cooling mechanism is used to prevent a temperature rise in a general power conversion unit, it may be difficult to prevent the temperature rise.

On the other hand, in the electronic control unit as described above, a semiconductor integrated circuit having a large temperature limitation, such as a microcomputer, is mounted. Therefore, in the electric connection box 10 in which the power conversion unit and the electronic control unit are integrated, even when a heat generation amount of the electronic control unit itself is small, the electronic control unit may be influenced by heat generation of the power conversion unit existing in the vicinity thereof and a temperature may rise, and heat damage may be generated in the electronic control unit. Therefore, a special mechanism is mounted on the electric connection box 10 to prevent the generation of the heat damage of the electronic control unit.

<Detailed Description of Configuration of Electric Connection Box>

The electric connection box 10 shown in FIGS. 1 and 8 is one in which three units are combined and integrated. That is, after the power supply control unit 30 shown in FIG. 4 is stacked above the power conversion unit 20 shown in FIG. 5 to integrate the power conversion unit 20 and the power supply control unit 30 as shown in FIG. 7, the integrated apparatus in FIG. 7 is placed and fixed above the cooling unit 40 shown in FIG. 6, so that the electric connection box 10 in FIGS. 1 and 8 is configured.

A housing 31 of the power supply control unit 30 shown in FIG. 4 is formed in a hollow box shape. A circuit board of the electronic control unit for controlling a power supply is housed in the housing 31. Bolts 32 for performing fixing are arranged at four positions on a peripheral portion of the housing 31. Further, connector portions 33 and 34 shown in FIG. 8 are arranged in a state of being exposed to an outer side of the housing 31, so that electric connection with outside can be made. Further, an attachment portion 31a of the housing 31 of the power supply control unit 30 has a shape recessed inward, so that connection terminals 23 of the power conversion unit 20 arranged below the power supply control unit 30 as shown in FIG. 8 extend.

A housing 21 of the power conversion unit 20 shown in FIG. 5 is formed in a hollow box shape. A circuit board that implements a power conversion function is housed in the housing 21. A plurality of connection terminals 23 protrude from an upper surface of the housing 21. Further, coupling portions 24 for fixing the bolts 32 are formed at positions of four corners of the housing 21. A radiator 22 is fixed below the housing 21. The radiator 22 has a large surface area so that heat generated in the circuit board inside the housing 21 is efficiently radiated. That is, the power conversion unit 20 includes a large number of fins 22a formed so as to protrude downward with a small width from a bottom surface of the housing 21. Each fin 22a is formed to be elongated so as to extend in a Z-axis direction. Further, the large number of fins 22a are arranged at substantially constant intervals in parallel with an X-axis direction.

In a state where the power conversion unit 20 and the power supply control unit 30 are integrated as shown in FIG. 7, an interval between the upper surface of the housing 21 on a power conversion unit 20 side and a lower surface of the housing 31 on a power supply control unit 30 side is regulated and held constant by a plurality of interval holding portions 39 shown in FIG. 3. Therefore, a gap portion 50 having a fixed dimension is formed between the facing housings 21 and 31. The gap portion 50 has a function of preventing a temperature rise of the power supply control unit 30, as will be described below.

A housing 41 of the cooling unit 40 shown in FIG. 6 includes a bottom plate portion 41a, side plate portions 41b and 41c, and an air blower holding portion 41d. Further, a cover 44 for regulating a flow of an airflow is integrally formed on an upper portion of the housing 41. The bottom plate portion 41a and the side plate portions 41b and 41c of the housing 41 can house the integrated power conversion unit 20 and the power supply control unit 30 as shown in FIG. 1.

The air blower holding portion 41d of the housing 41 holds a plurality of air blowers 42 and 43. Each of the air blowers 42 and 43 has a fan rotated by driving an electric motor. The fans of the air blowers 42 and 43 can blow air in a direction toward the power conversion unit 20 and the power supply control unit 30 placed on the bottom plate portion 41a (direction opposite to an arrow of a Z-axis).

Most of an airflow generated by air blowing of the air blowers 42 and 43 is introduced into, for example, a space 45 between the bottom plate portion 41a and the radiator 22 shown in FIG. 3 and flows in a direction opposite to the arrow of the Z-axis. Here, since the fins 22a of the radiator 22 extend in the Z-axis direction, the flow of the airflow generated by the air blowing of the air blowers 42 and 43 is not disturbed. Therefore, a flow rate of air that is in contact with surfaces of the fins 22a can be prevented from decreasing, and high heat radiation efficiency can be obtained.

Since the cover 44 is disposed above the cooling unit 40, a part of the airflow generated by the air blowing of the air blowers 42 and 43 is guided toward a space of the gap portion 50 formed between the power conversion unit 20 and the power supply control unit 30 without being leaked to outside. That is, the airflow flows through the gap portion 50 in a direction opposite to the arrow of the Z-axis. Based on the airflow, the gap portion 50 functions as a heat insulation layer. That is, heat generated on the power conversion unit 20 side can be cut off so as not to be transferred to the power supply control unit 30 side, and even when a temperature on the power conversion unit 20 side becomes high, a temperature rise of the power supply control unit 30 can be prevented.

<Outline of Airflow and Heat Flow>

Figure 9:
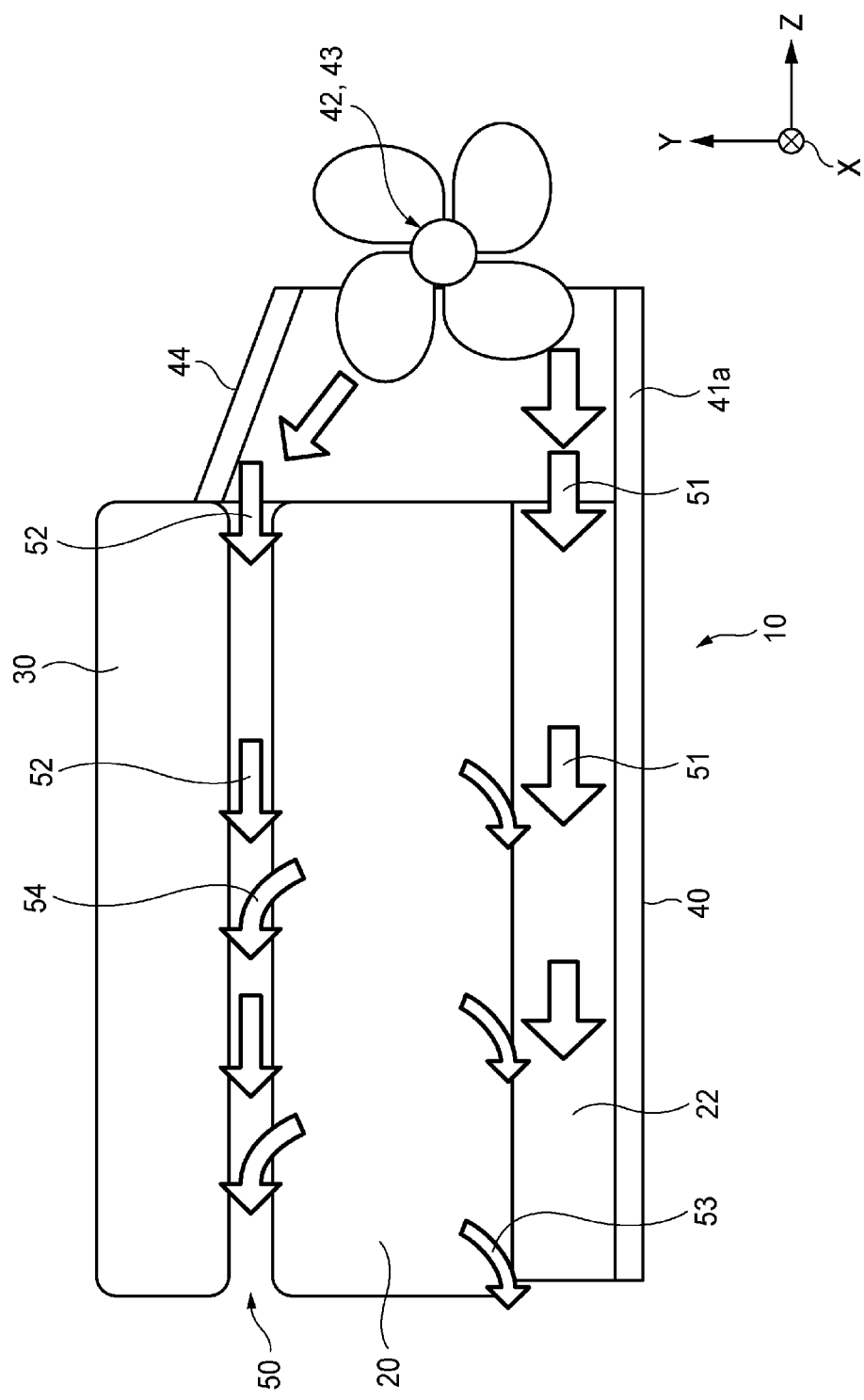
FIG. 9 is a vertical cross-sectional view of the electric connection box shown in FIG. 1 when viewed laterally.

FIG. 9 shows an outline of a state of an airflow and a heat flow in a cross section of the electric connection box 10 shown in FIG. 1 when viewed laterally.

As shown in FIG. 9, in a space between the bottom plate portion 41a and the radiator 22 below the power conversion unit 20, an airflow 51 generated by the air blowing of the air blowers 42 and 43 flows at a sufficiently high flow velocity in a direction opposite to arrows of a Z-axis. Therefore, a heat flow 53 is generated as heat conduction from the radiator 22 mounted on the power conversion unit 20 to the airflow 51, and a temperature rise of the power conversion unit 20 is prevented. That is, the power conversion unit 20 can be forcibly cooled by the cooling unit 40.

A direction of the airflow 52 generated by the air blowing of the air blowers 42 and 43 is regulated by the cover 44, and the airflow 52 is guided toward a gap portion 50 side. That is, the airflow 52 flows through the space of the gap portion 50 in the direction opposite to the arrows of the Z-axis. Therefore, a heat flow 54 is generated as heat conduction from the housing 21 of the power conversion unit 20 to the airflow 52. That is, a part of the heat energy generated in the power conversion unit 20 is consumed in the gap portion 50 as the heat flow 54 before being transferred to the power supply control unit 30 side. Therefore, the gap portion 50 functions as a heat insulation layer and the temperature rise of the power supply control unit 30 is prevented.

<Configuration Example of Electric Circuit>

Figure 10:
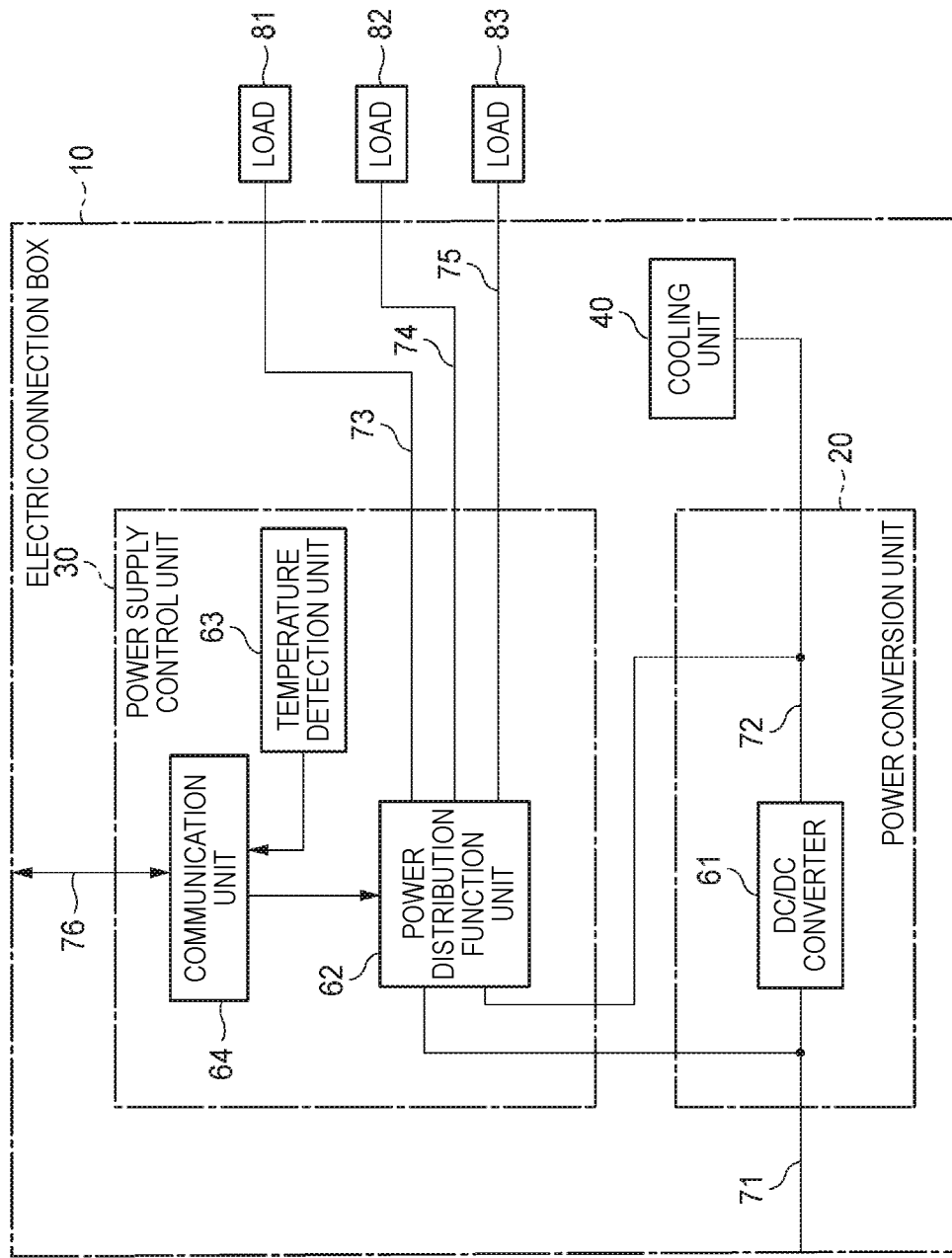
FIG. 10 is a block diagram showing a functional configuration example of the electric connection box shown in FIG. 1.

FIG. 10 shows a functional configuration example of the electric connection box 10 shown in FIG. 1.

The electric connection box 10 shown in FIG. 10 includes the power conversion unit 20, the power supply control unit 30, and the cooling unit 40. Further, the power conversion unit 20 has a function of a DC/DC converter 61 built therein. Further, the electronic control unit that constitutes the power supply control unit 30 has functions of a power distribution function unit 62, a temperature detection unit 63, and a communication unit 64. The electronic control unit that constitutes the power supply control unit 30 is configured, for example, on a circuit board including an integrated circuit of a microcomputer.

Therefore, when a heat generation amount in the power conversion unit 20 is larger than that in the power supply control unit 30, and the power conversion unit 20 and the power supply control unit 30 are arranged close to each other, the power supply control unit 30 is influenced by the heat generation of the power conversion unit 20 and heat damage tends to be generated in the power supply control unit 30. However, the electric connection box 10 in the present embodiment is provided with the gap portion 50 shown in FIG. 9 and the gap portion 50 functions as a heat insulation layer, so that the heat damage of the power supply control unit 30 can be prevented.

In the configuration of FIG. 10, it is assumed that power supplies of two systems having different voltages are used. That is, a voltage of power supplied from a power supply line 71 on an input side of the electric connection box 10 is converted by the DC/DC converter 61, and power having a different voltage is supplied to a power supply line 72. For example, a rated voltage of the power supply line 71 is set to 48 [V], and a rated voltage of the power supply line 72 is set to 12 [V].

In the example of FIG. 10, since an input of the power supply control unit 30 is connected to the power conversion unit 20, the power supply control unit 30 can appropriately use two types of power supply voltages as necessary. The power distribution function unit 62 can appropriately control distribution of the power of power supply to be supplied to a plurality of output-side power supply lines 73, 74, and 75 in accordance with a situation. Different loads 81 to 83 are connected to outputs of the output-side power supply lines 73 to 75, respectively.

The communication unit 64 of the power supply control unit 30 is connected to a communication network on a given vehicle via a communication line 76. A host ECU (not shown) connected to the communication network can give an appropriate instruction to the power distribution function unit 62 via the communication network, the communication line 76, and the communication unit 64. The temperature detection unit 63 detects a temperature of the housing 31 or the like in the power supply control unit 30. The temperature detection unit 63 can transmit information of the detected temperature to the host ECU via the communication unit 64 and the communication line 76.

Therefore, the air blower can be controlled in accordance with a temperature of the power supply control unit 30. For example, when the temperature of the power supply control unit 30 is low, the air blowing by the air blowers 42 and 43 can be stopped or weakened. On the contrary, when the temperature of the power supply control unit 30 is high, the air blowing by the air blowers 42 and 43 can be intensified. Alternatively, when an unexpected large current flows due to a load, a short circuit in a wire harness, or the like, the host ECU can also perform control for preventing malfunction of the power distribution function unit 62 based on information of the detected temperature from the temperature detection unit 63.

In the example of FIG. 10, a power supply line of the cooling unit 40 is connected to the power supply line 72 of an output of the DC/DC converter 61, but may be connected to an output of the power supply control unit 30 or may be connected to a power supply line of another system.

Although the power conversion unit 20 shown in FIG. 10 has the DC/DC converter 61 built therein, another power conversion circuit such as an inverter may be built in the power conversion unit 20. When the inverter is built therein, the power conversion unit 20 can be used to drive a load such as an electric motor that requires AC power.

The electronic control unit that constitutes the power supply control unit 30 may have various functions in addition to the power distribution function unit 62. For example, when disconnection or the like is generated in the power supply line due to a vehicle collision or the like, the power supply control unit 30 may have a function of switching an energization path of a power supply so as to secure a power supply path for an important load, a function of controlling charging and discharging of a sub-battery, a function of supplying backup power from the sub-battery to a load, a function of detecting a failure such as wire harness disconnection, a short circuit, an abnormal current, and the like.

As described above, since the electric connection box 10 shown in FIG. 1 integrates the power conversion unit 20 and the power supply control unit 30, a wire harness that performs connection therebetween can be reduced, and an entire size can also be miniaturized.

When the power conversion unit 20 and the power supply control unit 30 are close to each other, heat damage tends to be generated in the power conversion unit 20 due to heat generation of the power supply control unit 30. However, as shown in FIG. 9, the gap portion 50 is formed so as to allow the airflow 52 to flow therethrough, so that the gap portion 50 functions as a heat insulation layer. Therefore, the temperature rise of the power supply control unit 30 can be prevented and the generation of the heat damage can be prevented. Accordingly, an increase in a capacity of the power conversion unit 20, that is, an increase in a heat generation amount can be dealt with.

The cooling unit 40 is provided with the cover 44 or the like so as to regulate a flow of an airflow, so that the common air blowers 42 and 43 are used to form the airflows 51 and 52 having paths different from each other. Further, a direction in which the fins 22a of the radiator 22 are formed (Z-axis direction) and a direction in which the air blowers 42 and 43 feed air are aligned, so that a flow of air in the vicinity of the radiator 22 becomes smooth and a sufficient flow rate can be secured. Therefore, efficient heat radiation from the radiator 22 becomes possible.

As shown in FIG. 10, when the temperature detection unit 63 is provided so as to transmit information of a temperature of the power supply control unit 30 to the host ECU, the air blowers can be controlled in accordance with the temperature of the power supply control unit 30. For example, when the temperature of the power supply control unit 30 is low, the air blowing by the air blowers 42 and 43 can be stopped or weakened. On the contrary, when the temperature of the power supply control unit 30 is high, the air blowing by the air blowers 42 and 43 can be intensified.

Here, characteristics of the electric connection box according to the embodiment of the present invention described above will be briefly summarized in the following [1] to [5].

[1] An electric connection box 10 that has a function of relaying power of power supply supplied from an input-side power supply line and supplying the relayed power of power supply to an output-side load on a vehicle, that includes a first circuit unit (power conversion unit 20) having a relatively large heat generation characteristic, a second circuit unit (power supply control unit 30) that has a heat generation amount smaller than that of the first circuit unit and tends to be influenced by a temperature rise, and an air blower (cooling unit 40) configured to blow air to the first circuit unit, and in which the first circuit unit and the second circuit unit are arranged in a state of being close to each other, the electric connection box 10 includes:

a gap portion (50) that is a space formed on a boundary between the first circuit unit and the second circuit unit, and is configured to allow air to flow through the space; and an airflow guide portion (a cover 44, a bottom plate portion 41a, and side plate portions 41b and 41c) configured to guide an airflow blown by the air blower to both the first circuit unit and the gap portion.

[2] The electric connection box according to the above [1], in which the first circuit unit includes a radiator (22) disposed on a side separated from the gap portion, the radiator is configured with a plurality of heat radiation fins (fins 22a) arranged in parallel to one another, and at least one of the air blower and the airflow guide portion blows air along an extending direction of the heat radiation fins.

[3] The electric connection box according to the above [1], further includes:

a first housing (21) in which the first circuit unit is housed and a second housing (31) in which the second circuit unit is housed, in which the gap portion is formed by a member (interval holding portion 39) configured to hold an interval between the first housing and the second housing constant.

[4] The electric connection box according to the above [1], in which the first circuit unit includes a power converter (DC/DC converter 61) including a semiconductor switching element, and the second circuit unit includes a controller (power distribution function unit 62) including a semiconductor integrated circuit.

[5] The electric connection box according to the above [4], in which the second circuit unit includes a temperature detection unit (63) configured to detect a temperature of an ambient environment, and a temperature information transmission unit (communication unit 64) configured to transmit information of a temperature detected by the temperature detection unit to outside.

What is claimed is:

1. An electric connection box that has a function of relaying power of a power supply supplied from an input-side power supply line and supplying a relayed power of the power supply to an output-side load on a vehicle, that includes a first circuit unit having a relatively large heat generation characteristic, a second circuit unit that has a heat generation amount smaller than that of the first circuit unit and tends to be influenced by a temperature rise, and an air blower configured to blow air to the first circuit unit, and in which the first circuit unit and the second circuit unit are arranged in a state of being close to each other, the electric connection box comprising:

a gap portion that is a space formed on a boundary between the first circuit unit and the second circuit unit, and is configured to allow air to flow through the space; and an airflow guide portion configured to guide an airflow blown by the air blower to both the first circuit unit and the gap portion.

2. The electric connection box according to claim 1, wherein the first circuit unit includes a radiator disposed on a side separated from the gap portion, the radiator is configured with a plurality of heat radiation fins arranged in parallel to one another, and at least one of the air blower and the airflow guide portion blows air along an extending direction of the heat radiation fins.

3. The electric connection box according to claim 1, further comprising:

a first housing in which the first circuit unit is housed and a second housing in which the second circuit unit is housed, wherein the gap portion is formed by a member configured to hold an interval between the first housing and the second housing constant.

4. The electric connection box according to claim 1, wherein the first circuit unit includes a power converter including a semiconductor switching element, and the second circuit unit includes a controller including a semiconductor integrated circuit.

5. The electric connection box according to claim 4, wherein the second circuit unit includes a temperature detection unit configured to detect a temperature of an ambient environment, and a temperature information transmission unit configured to transmit information of a temperature detected by the temperature detection unit to outside.

* * * * *